(12) United States Patent
Sato et al.

(10) Patent No.: US 12,108,526 B2
(45) Date of Patent: Oct. 1, 2024

(54) MODULE AND MANUFACTURING METHOD OF THE SAME

(71) Applicant: Japan Aviation Electronics Industry, Limited, Tokyo (JP)

(72) Inventors: Junya Sato, Tokyo (JP); Atsushi Tanaka, Tokyo (JP); Ryosuke Mitsui, Tokyo (JP); Yoshiaki Yamabayashi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 415 days.

(21) Appl. No.: 17/581,280

(22) Filed: Jan. 21, 2022

(65) Prior Publication Data

US 2022/0264742 A1 Aug. 18, 2022

(30) Foreign Application Priority Data

Feb. 16, 2021 (JP) ................. 2021-022417

(51) Int. Cl.
*H05K 1/02* (2006.01)
*H05K 1/18* (2006.01)
*H05K 3/30* (2006.01)

(52) U.S. Cl.
CPC ........... *H05K 1/0296* (2013.01); *H05K 1/181* (2013.01); *H05K 3/305* (2013.01)

(58) Field of Classification Search
CPC .................................................. H05K 1/0296
USPC ........................................................ 361/760
See application file for complete search history.

(56) References Cited

U.S. PATENT DOCUMENTS

| 6,786,737 B2 | 9/2004 | Tai et al. |
| 10,383,232 B2 | 8/2019 | Heikkinen et al. |
| 11,044,563 B2 | 6/2021 | Nakajima et al. |
| 2009/0180011 A1* | 7/2009 | Kricorissian .......... H05K 3/366 |
| | | 29/854 |

(Continued)

FOREIGN PATENT DOCUMENTS

| JP | H06-164107 A | 6/1994 |
| JP | 3694825 B2 | 9/2005 |
| JP | WO2012/049898 A | 4/2012 |

(Continued)

OTHER PUBLICATIONS

Taiwanese Office Action dated Jan. 12, 2023 in Taiwanese Application No. 111103089 with English translation.

(Continued)

*Primary Examiner* — Stanley Tso
(74) *Attorney, Agent, or Firm* — Collard & Roe, P.C.

(57) ABSTRACT

A module is provided with a structural object and a connection member. The structural object is provided with an electronic device and a resin portion. The electronic device has an electrode. The electronic device is embedded in the resin portion. The electrode is exposed from the resin portion. The connection member is provided with a film-like base member, an adhesive layer 34 provided on the film-like base member and a wiring formed on the adhesive layer at least in part. The connection member is stuck to the structural object. At least a part of the resin portion of the structural object is directly stuck to the adhesive layer of the connection member. The wiring is pressed to the electrode of the electronic device.

7 Claims, 6 Drawing Sheets

(56) References Cited

U.S. PATENT DOCUMENTS

2013/0176746 A1     7/2013   Nishimura et al.

FOREIGN PATENT DOCUMENTS

| | | |
|---|---|---|
| JP | 5359550 B2 | 12/2013 |
| JP | 6293938 B1 | 3/2018 |
| JP | 2018-524799 A | 8/2018 |
| TW | 201520049 * | 6/2015 |
| TW | 201520049 A | 6/2015 |

OTHER PUBLICATIONS

The Technology for Embed an Electronic Components into the Plastic Molded Product (Wakahiro Kawai, Journal of The Japan Institute of Electronics Packaging, 2020 vol. 23 Issue 6).

* cited by examiner

MODULE AND MANUFACTURING METHOD OF THE SAME

CROSS REFERENCE TO RELATED APPLICATIONS

This application is based on and claims priority under 35 U.S.C. § 119 to Japanese Patent Application No. JP2021-022417 filed Feb. 16, 2021, the contents of which are incorporated herein in their entirety by reference.

BACKGROUND OF THE INVENTION

This invention relates to a module and a manufacturing method thereof, particularly, to a module provided with a connection member having an adhesive layer and to a manufacturing method thereof.

Japanese Patent No. 6293938 (Patent Document 1) discloses an example of a module in which an electronic device is mounted on a connection member having an adhesive layer.

Figure 11:
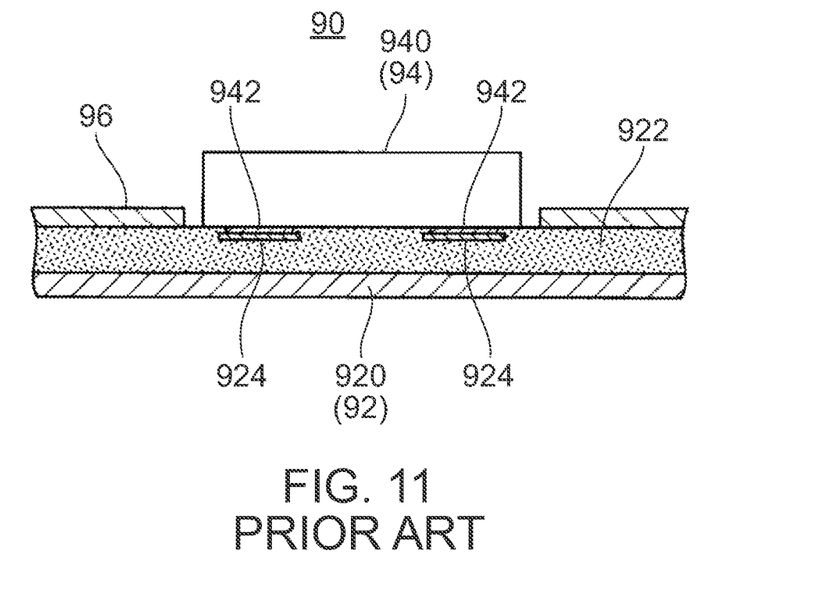
FIG. 11 is a cross-sectional view showing a module of Patent Document 1.

Referring to FIG. 11, a module 90 described in Patent Document 1 is provided with a base member with wirings (a connection member) 92, a microphone (an electronic device) 94 mounted on the base member with the wirings 92 and a cover film 96.

As shown in FIG. 11, the base member with the wirings 92 has a film 920, an insulating adhesive layer (an adhesive layer) 922 and conductive patterns 924. The film 920 is thin and flexible. The insulating adhesive layer 922 is formed on the film 920. The insulating adhesive layer 922 has elasticity and is elastically deformable. The conductive pattern 924 is formed on an upper surface of the insulating adhesive layer 922. The cover film 96 is formed to cover the upper surface of the insulating adhesive layer 922 except for a predetermined area. The cover film 96 is thin and flexible.

As shown in FIG. 11, the microphone 94 has a body portion 940 and terminals 942. The terminals are provided on a lower surface of the body portion 940. The microphone 94 is disposed in the predetermined area of the base member with the wirings 92. The terminals 942 of the microphone 94 correspond to the conductive patterns 924, respectively, and each of the terminals 942 is brought into contact with the conductive pattern 924 corresponding thereto.

As understood from FIG. 11, the insulating adhesive layer 922 adheres to the body portion 940 of the microphone 94 in part. This is because the insulating adhesive layer 922 has the elasticity. In detail, when the microphone 94 is mounted on the base member with the wirings 92, the insulating adhesive layer 922 is elastically deformed by strongly pressing the microphone 94 onto the base member with the wirings 92 by using an external force. At this time, the body portion 940 of the microphone 94 is pressed on the insulating adhesive layer 922 in part, and the insulating adhesive layer 922 adheres to the body portion 940 of the microphone 94 in part. Even after the external force is removed, the insulating adhesive layer 922 remains adhering to the body portion 940 of the microphone 94 in part.

As understood from FIG. 11, an elastic reaction force is caused in the insulating adhesive layer 922. The elastic reaction force draws the microphone 94 toward the base member with the wirings 92. Thus, the terminals 942 of the microphone 94 are pressed to the conductive patterns 924 of the base member with the wirings 92, respectively. In this way, each of the terminals 942 of the microphone 94 is electrically connected to the conductive pattern 924, corresponding thereto, of the base member with the wirings 92.

SUMMARY OF THE INVENTION

In the module 90 described in Patent Document 1, the base member with the wirings 92 is flexible while the microphone 94 is not flexible. Accordingly, when the module 90 is bent, the microphone 94 might be unstuck from the base member with the wirings 92. In other words, the module 90 of Patent Document 1 has a problem that electric connection between the terminals 942 and the conductive patterns 942 might be cut at least in part when the module 90 is bent. Therefore, a module is required which is tolerant of being bent, or which can maintain electric connection between a wiring board and an electronic device maintains even if a module is bent.

It is an object of the present invention to provide a module which is tolerant of being bent and to provide a manufacturing method of the module.

One aspect of the present invention provides a module which comprises a structural object and a connection member. The structural object comprises an electronic device and a resin portion. The electronic device has an electrode. The electronic device is embedded in the resin portion. The electrode is exposed from the resin portion. The connection member comprises a film-like base member, an adhesive layer, which is formed on the film-like base member and includes a pressure-sensitive adhesive, and a wiring, which is formed on the adhesive layer at least in part. The connection member is stuck to the structural object. The resin portion of the structural object directly adheres to the adhesive layer of the connection member at least in part. The wiring is pressed on the electrode of the electronic device.

Another aspect of the present invention provides a method of manufacturing the module mentioned above. The method comprises: preparing the structural object; preparing the connection member; and sticking the structural object and the connection member on each other so that at least a part of the resin portion of the structural object is directly brough into contact with the adhesive layer of the connection member and that the wiring is pressed on the electrode of the electronic device.

In the module of the aspect of the present invention, the electronic device is embedded in the resin portion, and at least a part of the resin portion directly adheres to the adhesive layer. Accordingly, even when the module is bent, the electronic device is pressed by the resin member, and thereby the electric connection can be maintained.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 1:
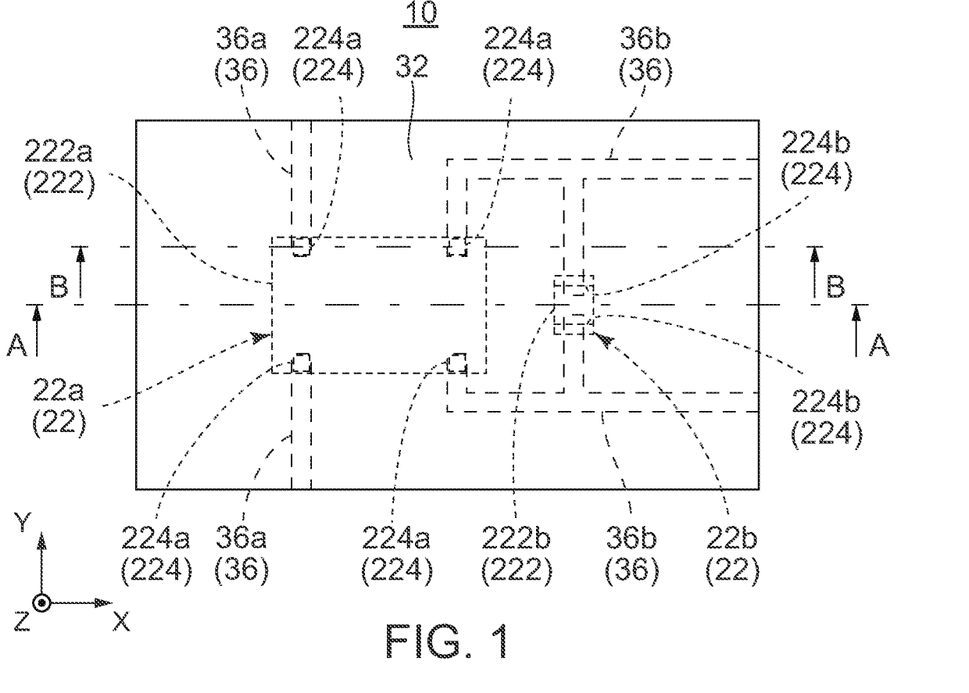
FIG. 1 is a plan view showing a module according to an embodiment of the present invention. Each of an electronic device included in a structural object and wirings included in a connection member is shown by a dashed line.
Figure 2:
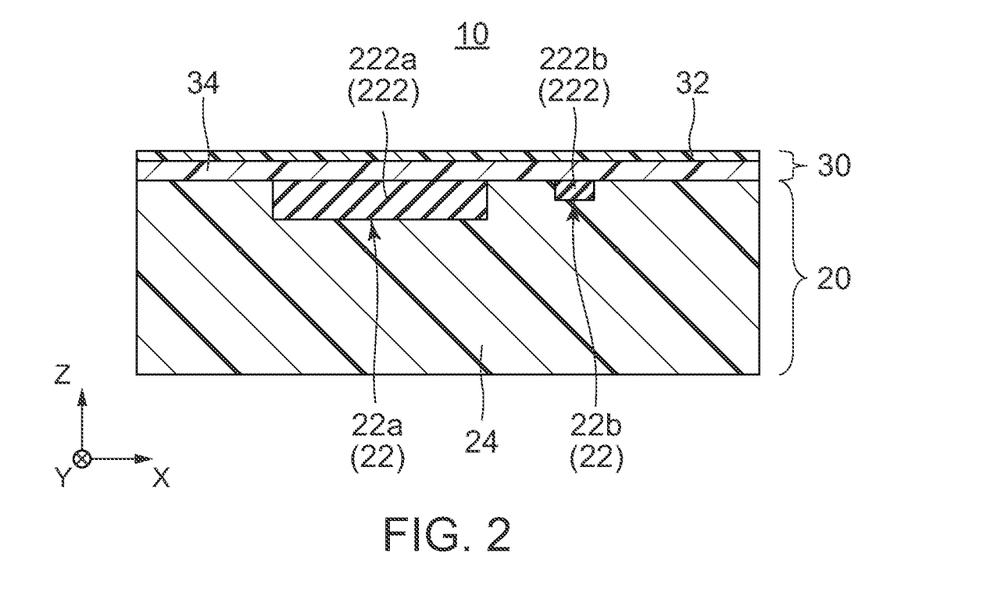
FIG. 2 is a cross-sectional view showing the module of FIG. 1, taken along line A-A.
Figure 3:
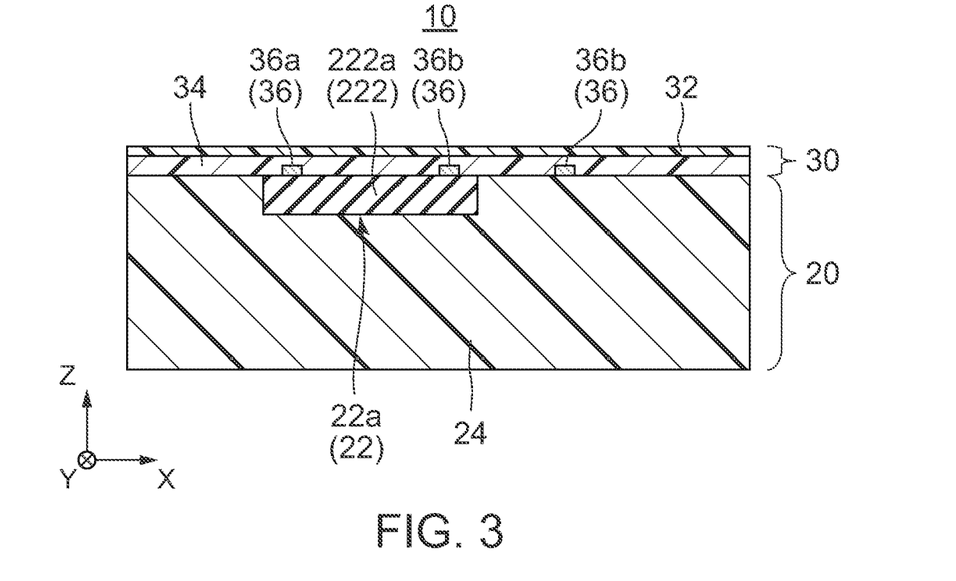
FIG. 3 is a cross-sectional view showing the module of FIG. 1, taken along line B-B. A thickness of each of the wirings is magnified in comparison with a thickness of a film-like base member and a thickness of an adhesive layer.

Referring to FIGS. 1 to 3, a module 10 according to an embodiment of the present invention is provided with a structural object 20 and a connection member 30. The connection member 30 is located on the structural object 20 and stuck to the structural object 20. In the present embodiment, an up-down direction is a Z-direction. A positive Z-direction is directed upward while a negative Z-direction is directed downward.

Figure 4:
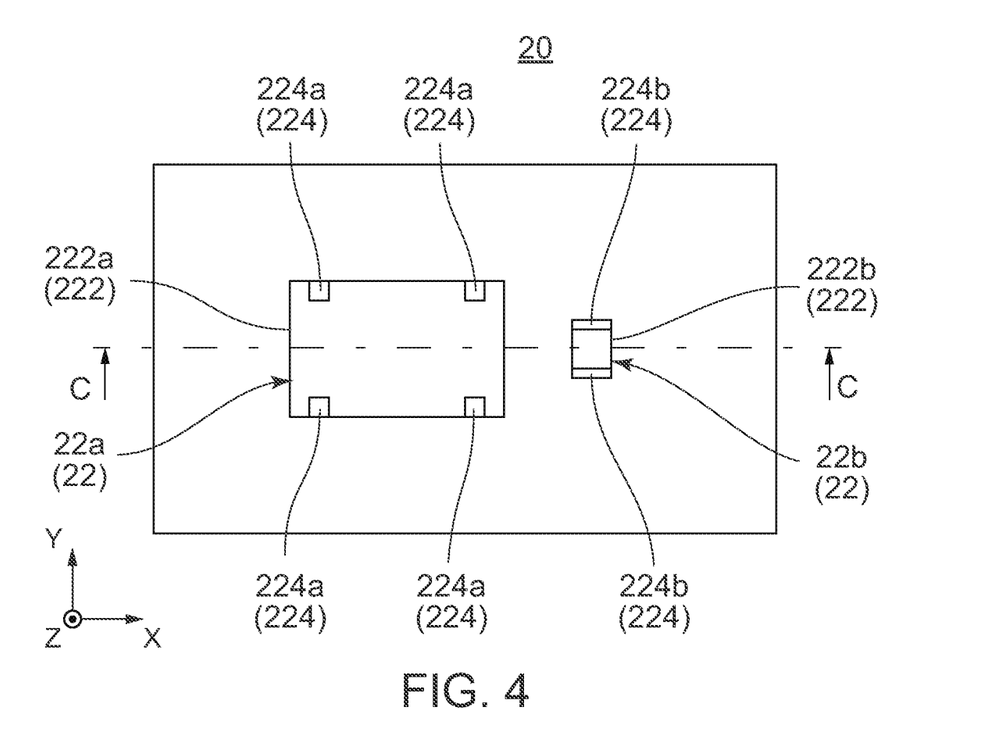
FIG. 4 is a plan view showing the structural object included in the module of FIG. 1.
Figure 5:
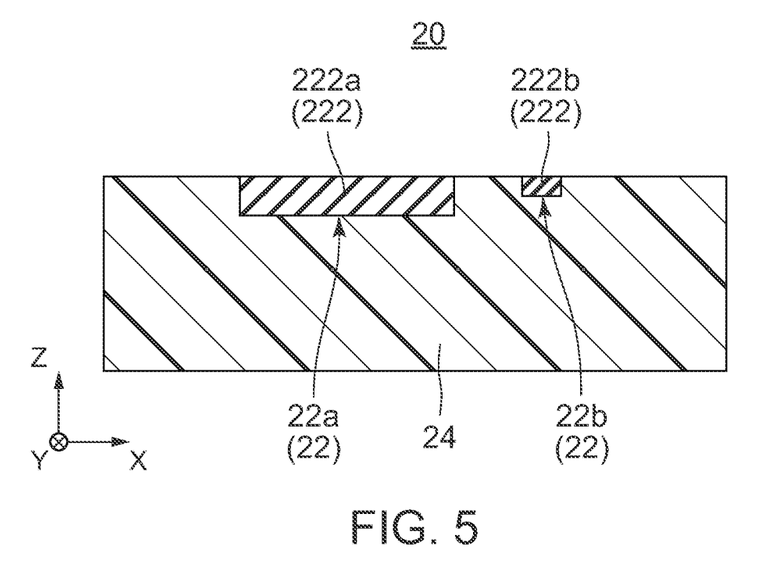
FIG. 5 is a cross-sectional view showing the structural object of FIG. 4, taken along line C-C.

Referring to FIGS. 4 and 5, the structural object 20 is provided with two electronic devices 22 (22a, 22b) and a resin portion 24. The electronic devices 22a and 22b are arranged apart from each other in a front-rear direction. In the present embodiment, the front-rear direction is an X-direction. However, the present invention is not limited thereto. The structural object 20 may be provided with one or more electronic devices 22 according to a function of the module 10. In the present invention, the function of the module 10 is not particularly limited, and a function of each of the electronic devices 22 (22a, 22b) is also not particularly limited.

As shown in FIGS. 4 and 5, the electronic device 22a has a body portion 222a and electrodes 224a. In the present embodiment, the body portion 222a of the electronic device 22a has a shape of a rectangular parallelepiped. The electrodes 224a are exposed on an upper surface of the body portion 222a and are four in number. In the present embodiment, the upper surface of the body portion 222a and upper surfaces of the electrodes 224a are flush with one another.

As shown in FIGS. 4 and 5, the electronic device 22b has a body portion 222b and electrodes 224b. In the present embodiment, the body portion 222b of the electronic device 22b has a shape of a rectangular parallelepiped. The body portion 222b is smaller than the body portion 222a of the electronic device 22a in size. The electrodes 224b are exposed on an upper surface of the body portion 222b and are two in number. In the present embodiment, the upper surface of the body portion 222b and upper surfaces of the electrodes 224b are flush with one another.

In the present invention, structure of each of the electronic devices 22 (22a, 22b) is not limited to the above. Each of the body portions 222 (222a, 222b) may be freely set in shape and in size. Moreover, each of the electrodes 224 (224a, 224b) may be freely set in shape and in size. Further, the electrodes 224 (224a, 224b) may be freely set in number and in arrangement. In addition, the upper surfaces of the electrodes 224 (224a, 224b) may be located upward of the upper surface of the body portion 222 (222a, 222b).

As understood from FIGS. 4 and 5, each of the electronic devices 22a and 22b is embedded in the resin portion 24. In detail, the electronic device 22a is embedded in the resin portion 24 so that each of the electrodes 224a is exposed outside at least in part. Similarly, the electronic device 22b is embedded in the resin portion 24 so that each of the electrodes 224b is exposed outside at least in part. In the present embodiment, the whole of the upper surface of each of the electronic devices 22a and 22b is exposed outside. Moreover, in the present embodiment, the upper surfaces of the electronic devices 22a and 22b are flush with an upper surface of the resin portion 24. However, the present invention is not limited thereto. The upper surfaces of the electronic devices 22a and 22b may not be flush with the upper surface of the resin portion 24, provided that they can be regarded to be substantially flush with one another in consideration of elasticity of an adhesive layer 34 described later.

Figure 6:
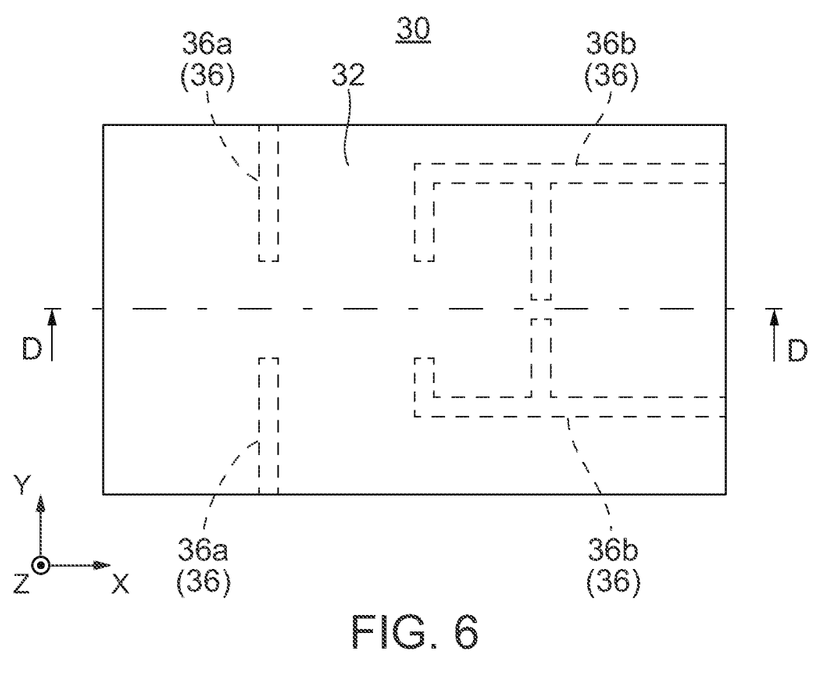
FIG. 6 is a plan view showing the connection member included in the module of FIG. 1. The wirings included in the connection member are shown by dashed lines.
Figure 7:
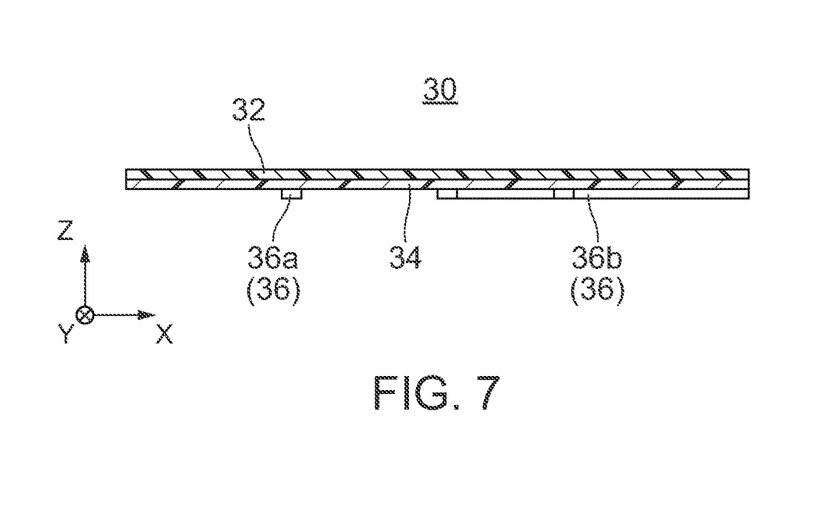
FIG. 7 is a cross-sectional view showing the connection member of FIG. 6, taken along line D-D. The thickness of each of the wirings is magnified in comparison with the thickness of the film-like base member and the thickness of the adhesive layer.

Referring to FIGS. 6 and 7, the connection member 30 is provided with a film-like base member 32, the adhesive layer 34 and wirings 36 (36a, 36b). The adhesive layer 34 is provided on a surface of the film-like base member 32. The wirings 36a and 36b are formed on a surface of the adhesive layer 34. In the present embodiment, each of the wirings 36a and 36b is entirely on the surface of the adhesive layer 34. However, the present invention is not limited thereto. Each of the wirings 36a and 36b should be formed on the adhesive layer 34 at least in part. For example, each of the wirings 36a and 36b may be formed on the film-like base member 32 in part.

In the present embodiment, as the film-like base member 32, a polyethylene terephthalate (PET) film may be used, for example. Moreover, as the adhesive layer 34, a resin including pressure-sensitive adhesive may be used, for example. As such resin, polyester-based, polyurethane-based, acryl-based, epoxy-based, phenol-based, silicone-based, polyolefin-based, polyimide-based, vinyl-based or natural macromolecule-based polymer may be used, for example. The adhesive layer 34 has elasticity and is elastically deformable. Accordingly, when the adhesive layer 34 is pressed to an object, it is elastically deformed and adheres to the object. The wirings 36a and 36b are formed by using silver paste, for example. Formation of the wirings 36a and 36b onto the adhesive layer 34 can be carried out, for example, by printing patterns of conductive inks on a blanket using a printing method such as a screen-printing method and then transcribing the patterns on the adhesive layer 34 after firing the patterns.

As shown in FIG. 6, in the present embodiment, the wirings 36a and 36b are four in number. As understood from FIG. 1, the wirings 36a correspond to two of the electrodes 224a, respectively. The wirings 36b correspond to remaining two of the electrodes 224a, respectively, and correspond to the electrodes 224b, respectively. In other words, each of the electrodes 224a and 224b corresponds to any one of the wirings 36a and 36b. However, the present invention is not limited thereto. The wirings 36 may be freely set in number and in shape according to roles thereof.

As understood from FIGS. 1 to 3, the connection member 30 is stuck to the structural object 20 so that each of the electrodes 224a and 224b faces one of the wirings 36a and 36 corresponding thereto. In other words, each of the wirings 36a and 36b overlaps with one or two of the electrodes 224a and 224b corresponding thereto at least in part in a plan view. When the connection member 30 is stuck to the structural object 20, the adhesive layer 34 directly adheres to the structural object 20 at least in part. This is because each of the wirings 36a and 36b has a thin thickness and because the adhesive layer 34 is deformable. In the present embodiment, the adhesive layer 34 adheres to almost the whole of the upper surface of the structural object 20 except for areas where the wirings 36a and 36b are formed. However, the present invention is not limited thereto. In a plan view, the adhesive layer 34 may be smaller than the structural object 20 in size.

As understood from FIGS. 2 and 3, the adhesive layer 34 of the connection member 30 directly adheres to not only the electronic devices 22a and 22b of the structural object 20 but also the resin portion 24. In other words, at least a part of the resin portion 24 of the structural object 20 directly adheres to the adhesive layer 34 of the connection member 30. Moreover, as understood from FIG. 1, in the present embodiment, the adhesive layer 34 adheres to the resin portion 24 to surround each of the electronic devices 22a and 22b except for the areas where the wirings 36a and 36b are located when the module 10 is viewed in plan. In addition, the adhesive layer 34 is elastically deformed according to the thickness of each of the wirings 36a and 36b. With this structure, the wirings 36a and 36b are pressed to the electrodes 224a and 224b of the electronic devices 22a and 22b by an elastic reaction force of the adhesive layer 34. Thus, a secure electric connection can be realized between each of the electrodes 224a and 224b and one of the wirings 36a and 36b corresponding thereto.

Additionally, in the present embodiment, the adhesive layer 34 may include a thermosetting resin component or an ultraviolet curing resin component. In that case, the adhesive layer 34 may be subjected to a hardening treatment at least in part. When the adhesive layer 34 elastically deformed is subjected to the hardening treatment, internal stress remains in the adhesive layer 34. In that case, each of the wirings 36a and 36b is pressed to one or two of the electrodes 224a and 224b of the electronic devices 22a and 22b corresponding thereto by the internal stress of the adhesive layer 34. In this way, a secure electric connection can be realized between each of the electrodes 224a and 224b and one of the wirings 36a and 36b corresponding thereto.

Figure 8:
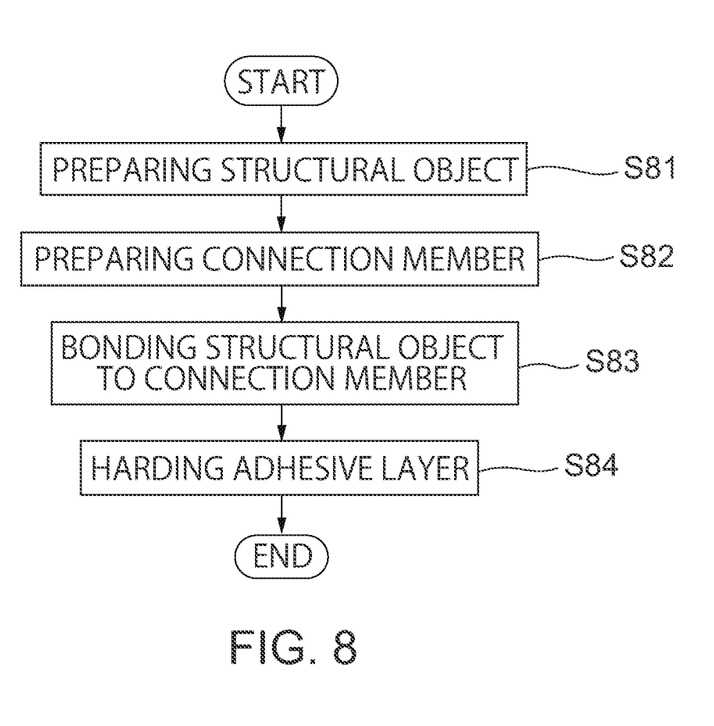
FIG. 8 is a flowchart showing a method of manufacturing the module of FIG. 1.

Hereinafter, referring to FIGS. 8 to 10 in addition to FIGS. 1 to 7, the description will be made about a method of manufacturing the module 10.

First, the structural object 20 shown in FIGS. 4 and 5 is prepared (S81). Next, the connection member 30 shown in FIGS. 6 and 7 is prepared (S82). However, the preparing of the connection member 30 may be carried out before the preparing of the structural object 20. In other words, the preparing of the structural object 20 and the preparing of the connection member 30 may be carried out in switched order or at the same time.

Figure 9:
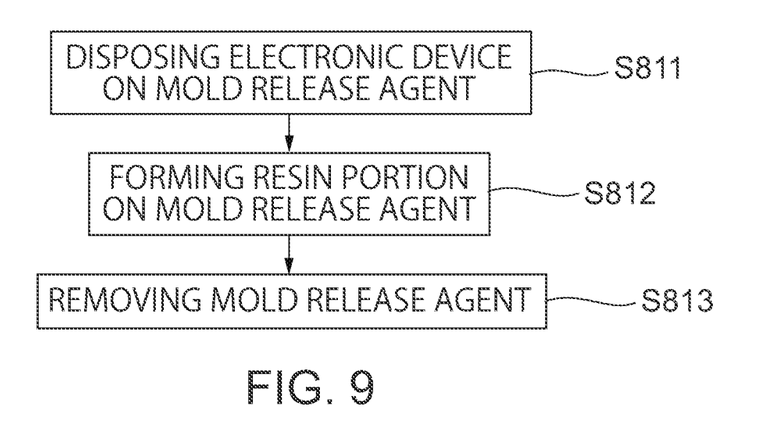
FIG. 9 is a flowchart showing an example of a process of preparing the structural object (S81) in the flowchart of FIG. 8.

The preparing of the structural object 20 (S81) may be carried out as shown in FIG. 9, for example.

Referring to FIG. 9, first, the electronic devices 22a and 22b (see FIGS. 4 and 5) are disposed on a mold release agent (not shown) (S811). At this time, the electronic devices 22a and 22b are disposed on the mold release agent so that the electrodes 224a and 224b of the electronic devices 22a and 22b are brought into contact with the mold release agent. Next, a liquid resin member (not shown) is put on the mold release agent to cover the electronic devices 22a and 22. Subsequently, the liquid resin member is hardened to form the resin portion 24 of the structural object 20 (S812). Then, the mold release agent is removed from the electronic devices 22a and 22b and the resin portion 24 (S813). Thus, the structural object 20 is obtained.

In the present embodiment, a PET film may be used as the mold release agent. The resin portion 24 may be formed by injection molding using acrylonitrile-butadiene-styrene (ABS) resin, for example.

Figure 10:
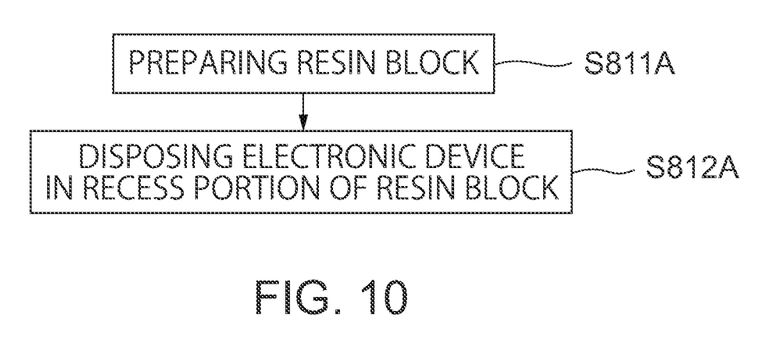
FIG. 10 is a flowchart showing another example of the process of preparing the structural object in the flowchart of FIG. 8.

The preparing of the structural object 20 (S81) may be carried out as shown in FIG. 10.

Referring to FIG. 10, first, a resin block (not shown) is prepared (S811) which has a surface in which recess portions (not shown) are formed to correspond to the electronic devices 22a and 22b (see FIGS. 4 and 5). Next, the electronic devices 22a and 22b are disposed in the recess portions of the resin block (S812). At this time, the electronic devices 22a and 22b are arranged so that the electrodes 224a and 224b of the electronic devices 22a and 22b are directed outward of the resin block. In addition, the electronic devices 22a and 22b are arranged so that the surfaces of the electrodes 224a and 224b are flush with the surface of the resin block. The electronic devices 22a and 22b may be fixed to the resin block by using adhesive or the like. Thus, the structural object 20 is obtained.

Referring FIG. 8 again, the structural object 20 prepared and the connection member 30 prepared adhere to each other to obtain the module 10 shown in FIGS. 1 to 3 (S83). This adhering is carried out so that at least a part of the resin portion 24 of the structural object 20 is directly brough into contact with the adhesive layer 34 of the connection member 30 and that each of the wirings 36a and 36b is pressed to one or two of the electrodes 224a and 224b corresponding thereto.

In detail, the structural object 20 and the connection member 30 are arranged so that each of the wirings 36a and 36b overlaps with one or two of the electrodes 224a and 224b corresponding thereto at least in part in a plan view. In addition, the connection member 30 is pressed to the structural object 20 so that the adhesive layer 34 of the connection member 30 is directly brought into contact with the upper surface of the structural object 20 and that a desired adhering force is obtained between the adhesive layer 34 and the structural object 20. As a result, each of the wirings 36a and 36 is pressed to one or two of the electrodes 224a and 224b corresponding thereto. On the other hand, the adhesive layer 34 can be brought into contact with the structural object 20 owing to elastic deformation of the adhesive layer 34 regardless of presence of the wirings 36a and 36b. The adhesive layer 34 is directly brought into contact with not only the electronic devices 22a and 22b but also the resin portion 24. It is desirable that an area where the adhesive layer 34 is brought into contact with the resin portion 24 surrounds each of the electronic devices 22a and 22b. In the present embodiment, the adhesive layer 34 is directly brought into contact with the whole of the upper surface of the structural object 20 except for the areas where the wirings 36*a* and 36*n* are located. Thus, the adhesive layer 34 adheres to the electronic devices 22*a* and 22*b* and the resin portion 24. According to this method, even when the structural object 20 is made of material unsuitable for printing a wiring, wiring to the electronic devices 22*a* and 22*b* included in the structural object 20 can be carried out by using the wirings 36 formed by printing.

Next, the adhesive layer 34 is hardened (S84). This hardening is carried out when the adhesive layer 34 includes the thermosetting resin component or the ultraviolet curing resin component. In other words, this hardening is not essential. Alternatively, the adhesive layer 34 may be hardened not in whole but in part. For example, the adhesive layer 34 may be hardened only in an area near each of the electronic devices 22*a* and 22*b*. When the adhesive layer 34 includes the thermosetting resin component, the adhesive layer 34 is hardened by carrying out a heating process. On the other hand, when the adhesive layer 34 includes the ultraviolet curing resin component, the adhesive layer 34 is hardened by carrying out an ultraviolet ray applying process.

In the present embodiment, the connection member 30 can be easily removed from the structural object 20 in a case where the adhesive layer 34 is not hardened. In this case, a rework, such as a replacement of the connection member 30 or a replacement of the electronic device 22*a* or 22*b*, can be easily carried out.

Moreover, according to the present embodiment, except for a case where the thermosetting resin component is heat-hardened, the module 10 can be manufactured without carrying out a high-temperature heat process. In other words, a material which does not have a thermal tolerance can be used as a material for at least a part of the module 10.

Although the specific explanation about the present invention is made above referring to the embodiments, the present invention is not limited thereto but susceptible to various modifications and alternative forms without departing from the spirit of the invention. For example, the connection member 30 may be formed with an electric element, such as a resister or a coil in addition to the wirings 36.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A module comprising a structural object and a connection member, wherein:
   the structural object comprises an electronic device and a resin portion;
   the electronic device has an electrode;
   the electronic device is embedded in the resin portion;
   the electrode is exposed from the resin portion;
   the connection member comprises a film-like base member, an adhesive layer, which is formed on the film-like base member and includes a pressure-sensitive adhesive, and a wiring, which is formed on the adhesive layer at least in part;
   the connection member is stuck to the structural object;
   the resin portion of the structural object directly adheres to the adhesive layer of the connection member at least in part; and
   the wiring is pressed on the electrode of the electronic device;
   wherein when the module is viewed in a plan, the adhesive layer adheres to the resin portion to surround the electronic device except for an area where the wiring is located.

2. The module as recited in claim 1, wherein the wiring is pressed on the electrode of the electronic device by an elastic reaction force of the adhesive layer.

3. The module as recited in claim 1, wherein:
   the adhesive layer is subjected to a hardening treatment; and
   the wiring is pressed on the electrode of the electronic device by an internal stress of the adhesive layer.

4. A method of manufacturing the module as recited in claim 1, comprising:
   preparing the structural object;
   preparing the connection member; and
   sticking the structural object and the connection member on each other so that at least a part of the resin portion of the structural object is directly brought into contact with the adhesive layer of the connection member and that the wiring is pressed on the electrode of the electronic device.

5. The method as recited in claim 4, wherein the preparing of the structural object comprises:
   disposing the electronic device on a mold release agent so that the electrode is brought into contact with the mold release agent;
   providing a resin member on the mold release agent to cover the electronic device;
   hardening the resin member to form the resin portion; and
   removing the mold release agent after the forming of the resin portion.

6. The method as recited in claim 4, wherein the preparing of the structural object comprises:
   preparing a resin block with a recess portion formed in a surface thereof as the resin portion; and
   disposing the electronic device in the recess portion.

7. The method as recited in claim 4, wherein the method further comprises hardening the adhesive layer.

* * * * *